United States Patent
Bancel et al.

(10) Patent No.: US 7,577,886 B2
(45) Date of Patent: Aug. 18, 2009

(54) METHOD FOR TESTING AN ELECTRONIC CIRCUIT COMPRISING A TEST MODE SECURED BY THE USE OF A SIGNATURE, AND ASSOCIATED ELECTRONIC CIRCUIT

(75) Inventors: Frédéric Bancel, Lamanon (FR); David Hely, Les Pennes Mirabeau (FR)

(73) Assignee: STMicroelectronics, SA, Montrouge (FR)

( * ) Notice: Subject to any disclaimer, the term of this patent is extended or adjusted under 35 U.S.C. 154(b) by 311 days.

(21) Appl. No.: 11/484,355

(22) Filed: Jul. 10, 2006

(65) Prior Publication Data

US 2007/0043986 A1    Feb. 22, 2007

(30) Foreign Application Priority Data

Jul. 8, 2005    (FR) ................................. 05 07281
Jul. 8, 2005    (FR) ................................. 05 07282

(51) Int. Cl.
*G01R 31/28* (2006.01)
(52) U.S. Cl. ........................................ 714/724; 714/48
(58) Field of Classification Search ................. 711/164; 705/75; 382/100; 726/2; 714/732, 725, 714/718, 724, 48
See application file for complete search history.

(56) References Cited

U.S. PATENT DOCUMENTS

| | | | | |
|---|---|---|---|---|
| 5,293,610 | A | * | 3/1994 | Schwarz ..................... 711/164 |
| 5,357,572 | A | | 10/1994 | Bianco et al. |
| 5,452,355 | A | | 9/1995 | Coli |
| 6,452,355 | B2 | | 9/2002 | Forster et al. |
| 7,076,667 | B1 | | 7/2006 | Gama et al. |
| 2003/0204801 | A1 | | 10/2003 | Tkacik et al. |
| 2003/0206627 | A1 | | 11/2003 | Penugonda et al. |
| 2003/0218475 | A1 | | 11/2003 | Gammel |
| 2004/0093310 | A1 | * | 5/2004 | Thomborson ................ 705/75 |

(Continued)

FOREIGN PATENT DOCUMENTS

EP    1089083    4/2001

(Continued)

OTHER PUBLICATIONS

David Hely, Frederic Bancel, Marie-Lise Flottes, Bruno Rouzeyre: "Test Control for Secure Scan Designs" Proceedings of the European Test Symposium 2005, IEEE 2005.

(Continued)

*Primary Examiner*—David Ton
(74) *Attorney, Agent, or Firm*—Graybeal Jackson LLP

(57) ABSTRACT

An electronic circuit comprises a plurality of configurable cells configured according to a chaining command signal. These configurable cells are configured either in a chained state in which the configurable cells are functionally connected in a chain to form a shift register, if the chaining command signal is in a first state, or in a functional state in which the configurable cells are functionally linked to logic cells with which they co-operate to form at least one logic circuit, if the mode command signal is in a second state. It is provided that a test data word will be preceded by a signature. The set formed by the digital signature and the data word forms a test sequence. The signature is verified before the introduction of the test data word by an appropriate detection circuit.

52 Claims, 1 Drawing Sheet

U.S. PATENT DOCUMENTS

2006/0200719 A1* 9/2006 Keller .................. 714/732
2006/0239501 A1* 10/2006 Petrovic et al. ............. 382/100
2007/0277225 A1* 11/2007 Rits et al. ..................... 726/2

FOREIGN PATENT DOCUMENTS

| EP | 1439398 | 7/2004 |
| EP | 1443338 | 8/2004 |
| FR | 2865828 | 8/2005 |

OTHER PUBLICATIONS

Michael J. Y. Williams and James B. Angell, "Enhancing Testability of Large-Scale Integrated Circuits via Test Points and Additional Logic" IEEE Transactions on Computers, vol. c-22, No. 1 Jan. 1973 pp. 46-60.

French Search Report for French Patent No. 0507282, INPI, Paris Apr. 13, 2006.

French Search Report for French Patent No. 0507281, INPI, Paris Apr. 13, 2006.

Yang, at al., "Scan Based Side Channel Attack on Dedicated hardware Implementations of Data Encryption Standard", International Test Conference, Proceedings ITC 2004, Publication Date Oct. 26-28, 2004, pp. 339-344.

McCarty, "Automatic Test Equipment 9ATE) on a Network (securing access to equipment and data)", Autotestcon Proceedings, 2000 IEEE Publication Date 2000. pp. 490-496.

* cited by examiner

METHOD FOR TESTING AN ELECTRONIC CIRCUIT COMPRISING A TEST MODE SECURED BY THE USE OF A SIGNATURE, AND ASSOCIATED ELECTRONIC CIRCUIT

PRIORITY CLAIM

This application claims priority from French patent application Nos. 0507282, filed Jul. 8, 2005, and 0507281, filed Jul. 8, 2005, which are incorporated herein by reference.

CROSS REFERENCE TO RELATED APPLICATIONS

This application is related to U.S. patent application Ser. No. 11/484,359 entitled INTEGRATED CIRCUIT COMPRISING A TEST MODE SECURED BY DETECTION OF A CONTROL SIGNAL STATE, which has a common filing date and owner and which is incorporated by reference.

TECHNICAL FIELD

An embodiment of the invention generally relates to synchronous electronic integrated circuits provided with combinatorial logic means, flip-flop circuits, and test means.

More specifically, an embodiment of the invention relates to an electronic circuit comprising a plurality of configurable cells, configured according to a chaining command signal:

either in a chained state in which the configurable cells are functionally connected in a chain to form a shift register, if the chaining command signal is in a first state;

or in a functional state in which the configurable cells are functionally linked to logic cells with which they co-operate to form at least one logic circuit, if the mode command signal is in a second state.

BACKGROUND

At present, there are well-known ways of testing for the proper working of the functional elements of an integrated circuit. This is done by the imposition and/or determination, at predefined instants, of the values of data present at certain internal points of this integrated circuit.

A technique of this kind for testing the internal paths of an integrated circuit, known as a "scanpath" or "internal scan method" is described for example in M. Williams and J. Angel, "Enhancing Testability of LSI Circuits Via Test Points and Additional Logic", IEEE Transactions on Computers, Vol. C-22, No. 1; Jan. 1973, which is incorporated by reference.

In this technique, each of the flip-flop circuits of the logic circuit, for which it is necessary to know the state and/or dictate the content during the standard operation of the integrated circuit, is provided at one input with a multiplexer. The different flip-flop circuits and the multiplexers that are associated with them thus constitute an equivalent number of configurable cells whose access points are controlled by these multiplexers.

The multiplexers of these different configurable cells are collectively controlled by a TAP (test access port) controller which, depending on a command signal defining a selected mode of operation, uses this set of configurable cells either as a standard functional circuit integrated with the logic circuit that it forms with the logic cells, or as a test circuit.

To do this, the TAP controller receives control signals on different command lines and/or address lines by which it is connected to the different configurable cells. These command signals are for example a mode command signal, a chaining command signal or again a data-propagation command signal that permits the modification of and/or modifies the data circulation paths within the integrated circuit and also enables the controller to capture data for subsequent analysis.

In standard operating mode, the TAP controller therefore drives the multiplexers of the configurable cells so that the flip-flop circuits of these cells are connected to surrounding logic cells to define one or more functional sub-units of the integrated circuit.

In the test mode, which is normally activated upon reception by the TAP controller of a command signal commanding passage into a test mode, this controller produces a chaining command signal to set up a series connection of the flip-flop circuits of the configurable cells so as to form a shift register.

This register has a series input and a series output respectively connected to one output and to one input of the TAP controller, as well as a clock input receiving a clock signal to set the rate of the datastream.

Initially, the TAP controller serially loads data into the flip-flop circuits of the configurable cells through the input of the shift register formed by these configurable cells.

Then, the TAP controller changes the switching of the multiplexers to form the functional circuit, and commands the execution of one of more clock cycles by this functional circuit. In this phase, the data loaded into the flip-flop circuits of the configurable cells are processed by the functional circuit.

The controller then changes the switching of the multiplexers once again to form the shift register once again and serially retrieves, at the output of this shift register, the data stored in the flip-flop circuits of the configurable cells during the last clock cycle.

Despite the confirmed value of this testing technique, its practical application can be a problem in certain circumstances, especially in integrated circuits that process secret data.

Because the activation of the test mode may enable an individual intent on fraud to read the contents of the flip-flop circuits of the configurable cells, this test technique has the drawback, in principle, of making such circuits very vulnerable to fraudulent use.

For example, by stopping a process of internal loading of secret data into the integrated circuit at various points in time, and by unloading the contents of the shift register, an individual intent on fraud could obtain information on secret data or even reconstitute this secret data.

By activating the test mode, an individual intent on fraud could also obtain write access to the flip-flop circuits of the configurable cells to insert fraudulent data or else to place the integrated circuit in an unauthorized configuration. He could thus, for example, access a register controlling a security element such as a sensor to deactivate it. He could also inject a piece of erroneous data in order to obtain information on a piece of secret data.

The individual intent on fraud may actually adopt two different strategies: the first strategy consists in taking control of the TAP controller and observing the contents of the cells of the shift register at the external pads; the second strategy consists in taking control of the configurable cells by exciting them by micro-probing so as to simulate the driving of these cells by the command signals emitted by the TAP controller.

SUMMARY

An embodiment of the present invention includes a method and an electronic circuit designed to thwart an attempt at fraud, whatever the strategy of fraud used.

To attain this goal, it is provided in this embodiment of the invention that a test data word will be preceded by a digital signature, the set formed by the digital signature and a data word forming a test sequence. The signature is verified before the use of the data word.

Thus, more specifically, a method according to an embodiment of the invention comprises the following steps in which, when the chaining command signal is in the first state:

a signature is entered successively in series into the shift register;

the input signature is verified, and an alert signal is produced if the input signature is different from the expected signature, or else a data word is entered successively in series into the register.

Thus, it is no longer possible to enter data into the shift register without knowing the signature. This thwarts any fraudulent attempt of the first type.

According to an embodiment of the invention, the signature is verified by comparison of all or part of the input signature with an associated reference word.

According to another embodiment of the invention, it is planned also to produce a warning signal when the chaining command signal is inconsistent with a test command signal received by a command circuit producing the chaining command signal. Thus, any attempt at fraud according to the second type is thwarted.

A method according to an embodiment of the invention is implemented in an electronic circuit according to an embodiment of the invention, comprising the elements described in the above introduction, wherein essentially the circuit also comprises a detection circuit laid out so that, if the chaining command signal is in the first state during the first period of time T1, it produces a warning signal if the content of a set of X1 configurable cells does not correspond to a first reference value.

The time T1 is the time taken for the loading, into the shift register, of all or part of the bits of the signature, X1 is a set of configurable cells, which may or may not be successive, into which all or part of the bits of the signature are input, each cell memorizing only one bit of the signature.

BRIEF DESCRIPTION OF THE DRAWING

Features and advantages of one or more embodiments of the invention shall appear more clearly from the following description, given by way of an indication that in no way restricts the scope of the invention, with reference to the appended single figure (FIG. 1 )which is a diagram illustrating an electronic circuit according to an embodiment of the invention.

DETAILED DESCRIPTION

Figure 1:
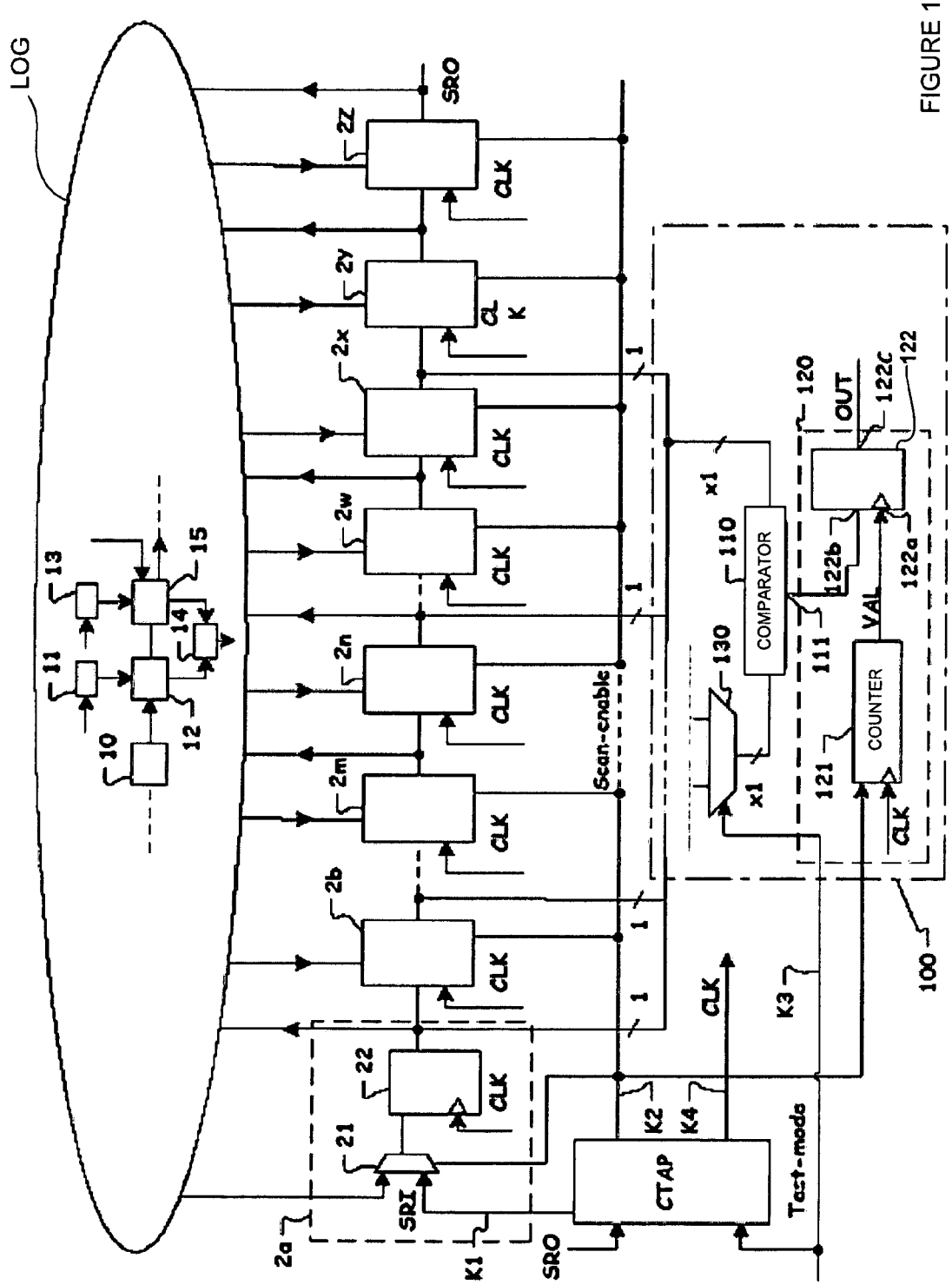

As announced here above, an embodiment of the invention relates to an electronic circuit provided with internal test means.

Referring to FIG. 1, such a circuit typically comprises a plurality of logic cells such as the cells 10 to 15, a plurality of configurable cells such as the cells 2a, 2b, . . . , 2m, 2n, . . . , 2w, 2x, 2y and 2z, a plurality of command lines such as the lines K1 to K4 as well as, if necessary, a controller such as an access port controller CTAP, which however may also be external to the electronic circuit concerned.

The command lines K1 to K4, at least some of which are connected to the configurable cells 2a to 2z, serve to transmit command signals that are selectively received and/or sent out in operation by the controller CTAP, such as a command signal TEST_MODE commanding passage into a test mode which activates the controller CTAP, the chaining command signal SCAN_ENABLE which chains the configurable cells in the form of a shift register, and a command signal SHIFT_DR which enables the propagation of data in the configurable cells.

Depending on these command signals or on at least some of them, the configurable cells 2a to 2z adopt either a standard mode of operation, in which they are functionally linked to at least logic cells 10 to 15 with which they co-operate to form a logic circuit LOG, or a test mode in which these configurable cells 2a to 2z are functionally connected to one another in a chain to form a shift register.

The passage of the configurable cells from the standard operating mode to the test mode is done by the driving of the multiplexers 21 using the command signal SCAN_ENABLE delivered by the controller CTAP.

The shift register 2a to 2z especially has a data input SRI driven by one output of the controller CTAP, a data output SRO, connected to one input of the controller CTAP, and one clock input (not specifically represented) to receive a clock signal CLK capable of setting the rate of the data flow in this shift register.

Typically, to launch a test, a signal TEST_MODE for commanding passage into a test mode is first of all sent to the controller CTAP on the command conductor K3.

The controller CTAP then configures the configurable cells 2a to 2z as a shift register by sending the chaining command signal SCAN_ENABLE.

Then, by emitting the propagation command signal CLK, the controller CTAP serially loads test data into the flip-flop circuit 22 of these configurable cells through the input SRI of the shift register.

Then, by deactivating the chaining command signal SCAN_ENABLE, the controller CTAP reconfigures the configurable cells 2a to 2z into a functional element of the logic circuit LOG and commands the execution of one or more clock cycles by this functional element, which processes the test data.

By reactivating the chaining command signal SCAN_ENABLE, the controller CTAP again reconfigures the configurable cells 2a to 2z into a shift register. Finally, by sending the propagation command signal CLK, the controller CTAP retrieves, at the output SRO of this register, the data that is stored in the flip-flop circuit 22 and comes from the processing of the test data by the logic circuit LOG.

To prevent a situation where an individual intent on fraud is able to simulate a test procedure of this kind by the direct application of the command signals to the lines K1 to K4, and/or data to the input SRI, and thus make it difficult to impossible for this person to retrieve the data stored in the flip-flop circuit 22 and that comes from the processing of the test data by the logic circuit LOG, the test data is preceded by a digital signal, the set consisting of the signature and the test data forming a test sequence.

Thus, according to an embodiment of the invention, by sending the propagation command signal CLK, the controller circuit CTAP first of all loads the digital signature serially into the shift register. Said signature is verified and, if the signature is accurate then, by sending the signal CLK, the command circuit loads the test data.

According to first mode of implementation, all the bits of the signature are loaded into the register. Then, after a complete loading, the signature is verified.

According to one variant, all the bits of the signature are verified. According to another variant, only one part of the bits of the signature is verified. For example, it is possible to verify only the bits ranked 1, 2, 5 and 10 of a ten-bit signature, loaded into the first 10 configurable cells of the shift register.

To verify a signature, the bits of said input signature (or only one part of said bits, depending on the chosen variant) are compared with corresponding bits of the expected signature.

According to another embodiment, the signature bits loaded into the register are verified several times as and when they are loaded into the register, the successive verifications being done in parallel with the loading of the signature. For example, during the loading of a 10-bit signature, the following operations are performed:

a first verification after the loading of two bits, during which the bits contained in the first and second ranked cells are verified, a second verification after the loading of 5 bits, during which the bits contained in the first, second and fifth ranked cells are verified, a third verification after the loading of 10 bits, during which the bits contained in the first, second, fifth and tenth ranked cells are verified.

Each verification of all or part of the signature consists in reading the bits to be verified in the register and comparing said bits with corresponding bits of an expected signature and, as the case may be, producing a warning signal according to the result of the comparison.

Verifying the signature several times as the signature is being loaded makes it possible to provide a early warning as soon as a false signature is detected. Thus, in the above example, at the first verification, if the first two bits are erroneous, the warning is given immediately without waiting for the complete loading of all the bits of the signature. If, by chance, a person intent on fraud knows the first two verified bits but not the following ones, then an error will be reported as soon as the second verification is made.

To use a test sequence according to an embodiment of the invention, and to verify the signature preceding the test data, the electronic circuit according to an embodiment of the invention includes a detection circuit 100 laid out so that, if the signal SCAN_ENABLE is active for a time T1, it produces a warning signal if the content of a set of X1 configurable cells does not correspond to a reference value.

In other words, the detection circuit 100 is laid out to verify the content of at least some of the configurable cells when they are configured as a shift register at the end of a period of time T1, and more specifically to ascertain that the bits (or at least some of said bits) loaded into the shift register at the end of the period of time T1 truly correspond to an expected signature (corresponding to the reference value). If the bits loaded into the shift register do not correspond to an expected signature, then the circuit 100 produces a warning signal OUT.

The time T1 is the time necessary for loading all or some, depending on the variants chosen, of the bits of the signature into the shift register.

The set of X1 configurable cells, whether adjacent or not, is the set of configurable cells for which the content is verified, this content including, as it happens, all or some of the bits of the digital signature.

For example, according to one variant, the set of X1 cells comprises the N first configurable cells of the shift register in which all the bits of the signature are stored. According to another variant, the set of X1 configurable cells comprises the configurable cells ranked 1, 2, 5 and 10 in which the bits ranked 1, 2, 5 and 10 of the signature are stored. After verification, the detection circuit 100 produces the warning signal OUT if the content of the shift register is different from an expected signature. According to one variant, the circuit 100 may also prohibit the continuation of the loading of the test data into the shift register. To this end, the circuit 100 may:

reset the configurable cells (to erase their content) and/or change the state of the chaining command signal SCAN_ENABLE (to reconfigure the configurable cells in normal operating mode) and/or inhibit the data-protection signal CLK so as to prohibit any propagation of data, to place the circuit in a totally blocked state.

According to one embodiment, appropriate for example when the bits of the signature are verified only once, for example at the end of the loading of all the bits of the signature, the detection circuit 100 comprises:

a comparator 110, to compare the content of the X1 configurable cells with the first reference value and produce the warning signal if the content of the X1 configurable cells does not correspond to the first reference value, and a validation circuit 120 to transmit the warning signal if the chaining command signal SCAN_ENABLE has been active during the first period of time T1.

The first reference value is, for example, stored in a register or a rewritable memory; the choice of the place of storage is a function especially of the degree of security desired, and the possibility if any of modifying the signature word, etc.

The time T1 is the time necessary for the loading into the register of the signature or at least one part of the signature. T1 is equal to the number of the bits of signature that are considered (assuming the bits are consecutive starting with the first bit), multiplied by the duration of one period of the clock cycle CLK which sets the rate of data input into the register. The circuit 120 activates the comparator after the input into the register of the bits of the signature.

The signature is verified by comparing all or part of the bits of the signature with an expected signature word.

In the illustrated example, the validation circuit 120 of the comparator 110 comprises:

a counter 121 activated by the chaining command signal SCAN_ENABLE, to count the pulses of a clock signal CLK and produce a validation signal VAL, a flip-flop circuit 122, comprising a clock input 122a to which the validation signal VAL is applied, a data input 122b connected to a data output 111 of the comparator 121, and an output 122c at which the warning signal OUT is produced.

The counter 121 has the function here of measuring the period of time T1 during which all or part of the signature is capable of being loaded into the shift register when the configurable cells are in chained mode (SCAN_ENABLE in the first, active state). At the end of the loading of all or part of the signature, the counter produces the validation signal VAL. The flip-flop circuit 122 stores the output signal of the comparator which it receives at its data input 122b, and reproduces the output signal at its output (this is the warning signal OUT) when it receives the validation signal VAL.

According to another embodiment, the detection circuit 100 is also laid out so that, if the chaining command signal SCAN_ENABLE is in the first state during a second period of time T2 greater than the first period of time T1, then at the end of the period of time T1, it produces a warning signal if the content of the set of X1 configurable cells does not correspond to the first reference value, and at the end of the period of time T2, it produces a warning signal if the content of the set of X2 configurable cells does not correspond to a second reference value.

This embodiment is appropriate if at least two tests are performed on the signature bits input into the register at different time intervals, for example one test after some of the bits of the signature have been loaded and one test after all the signature bits have been loaded.

According to an embodiment of the invention, the detection circuit 100 of the invention is also laid out to produce the warning signal OUT if the chaining command signal SCAN_ENABLE is in the first, active state while the mode command signal is in the second, inactive state. In other words, the detection circuit also detects an inconsistency between the mode command signal TEST_MODE and the chaining command signal SCAN_ENABLE, implying that the controller has been short-circuited by an individual intent on fraud.

According to one embodiment, the detection circuit of the invention comprises, for this purpose, a complementary selection circuit 130 to apply the following to a reference input of the comparator:

either the first reference value if the mode command signal TEST_MODE is in the first state, i.e. the active state, or a random value if the mode command signal TEST_MODE is in the second state, i.e. the inactive state.

The random value may be given, for example, by a random-number generator which is activated at the same time as the comparator, e.g., by the activation signal VAL. The random value is thus modified whenever the comparator is activated, in such a way that it is not possible for an individual intent on fraud to enter a correct signature corresponding to the random value.

Thus, whatever the signature chosen by a person intent on fraud, if any, if the TEST_MODE and SCAN_ENABLE signals are inconsistent (with one inactive and the other active), then the warning signal will be produced systematically.

Circuitry, such as that shown in FIG. 1, according to an embodiment of the invention may be incorporated into an integrated circuit (IC) such as a processor of memory, and one or more such ICs may be incorporated into an electronic system such as a computer system.

From the foregoing it will be appreciated that, although specific embodiments of the invention have been described herein for purposes of illustration, various modifications may be made without deviating from the spirit and scope of the invention.

What is claim is:

1. A method for testing an electronic circuit comprising a plurality of configurable cells configured according to a chaining command signal:
    either in a chained state in which the configurable cells are functionally connected in a chain to form a shift register, if the chaining command signal is in a first state;
    or in a functional state in which the configurable cells are functionally linked to logic cells with which they co-operate to form at least one logic circuit, if the mode command signal is in a second state,
    wherein the method comprises the following steps in which, when the chaining command signal is in the first state:
    an input signature is entered successively in series into the shift register;
    the input signature is verified, and
    an alert signal is produced if the input signature is different from an expected signature, or else a data word is entered successively in series into the register.

2. A method according to claim 1, wherein the step of verification of the signature is done at the end of the loading of the signature.

3. A method according to claim 1, wherein the step of verification of the signature is done in several sub-steps performed successively in parallel with the step of loading of the signature and wherein, at each sub-step, verification is carried out on an increasing number of bits of the signature and, depending on the result of the verification, the warning signal is produced or the loading of the signature is continued.

4. A method according to claim 1 wherein, to verify all or part of the bits of the signature, said bits are compared with an associated reference word.

5. A method according to claim 1 wherein, simultaneously with the warning signal:
    the configurable cells are reset and/or
    the chaining command signal changes state and/or
    the clock signal is inhibited.

6. A method according to claim 1, wherein the chaining command signal is produced in the first state by a control circuit such as an access controller when said control circuit receives a mode command signal in a first state, the method also comprising the following step, comprising:
    producing the warning signal if the chaining command signal is in the first state while the mode command signal is in the second state.

7. An electronic circuit comprising a plurality of configurable cells configured according to a chaining command signal:
    either in a chained state in which the configurable cells are functionally connected in a chain to form a shift register, if the chaining command signal is in a first state;
    or in a functional state in which the configurable cells are functionally linked to logic cells with which they co-operate to form at least one logic circuit, if the mode command signal is in a second state,
    wherein the circuit also comprises a detection circuit laid out so that, if the chaining command signal is in the first state during the first period of time, it produces a warning signal if the content of a set of configurable cells does not correspond to a first reference value.

8. A circuit according to claim 7, wherein the detection circuit is also laid out so that, if the chaining command signal is in the first state during a second period of time greater than the first period of time, then
    at the end of the first period of time, it produces a warning signal if the content of the set of configurable cells does not correspond to the first reference value, and
    at the end of the second period of time, it produces a warning signal if the content of the set of configurable cells does not correspond to a second reference value.

9. A circuit according to claim 7, wherein the detection circuit comprises:
    a comparator, to compare the content of the configurable cells with the first reference value and produce the warning signal if the content of the configurable cells does not correspond to the first reference value, and
    a validation circuit to transmit the warning signal if the chaining command signal has been active during the first period of time.

10. A circuit according to claim 7, wherein the detection circuit also comprises a selection circuit to apply the following to a reference input of the comparator:
    either the first reference value if the mode command signal is in the first state,
    or a random value if the mode command signal is in the second state.

11. A circuit according to claim 7, wherein the validation circuit of the comparator comprises:
    a counter activated by the chaining command signal to count the pulses of a clock signal and produce a validation signal,
    a flip-flop circuit, comprising a clock input to which the validation signal is applied, a data input connected to a data output of the comparator, and an output at which the warning signal is produced.

12. An electronic circuit, comprising:
    first logic cells configurable to compose a shift register that is operable to receive first data during an operating mode; and a detector coupled to the shift register and operable to,
compare a first portion of the first data to a first predetermined value, and
generate a first warning signal if the first portion of the first data does not have a predetermined relationship to the predetermined value.

13. The electronic circuit of claim 12 wherein each of the first logic cells comprises a respective flip flop.

14. The electronic circuit of claim 12 wherein the operating mode comprises a scan test mode.

15. The electronic circuit of claim 12 wherein the detector is further operable to prohibit the shift register from providing data if the first portion of the first data does not have the predetermined relationship to the predetermined value.

16. The electronic circuit of claim 12 wherein the detector is further operable to prohibit the shift register from receiving data if the first portion of the first data does not have the predetermined relationship to the predetermined value.

17. The electronic circuit of claim 12 wherein the first portion of the first data comprises consecutive bits.

18. The electronic circuit of claim 12 wherein the first portion of the first data comprises non consecutive bits.

19. The electronic circuit of claim 12 wherein the detector is operable to compare the first portion of the data after the shift register receives the first portion of the data.

20. The electronic circuit of claim 12, further comprising a second logic cell configurable to compose a logic circuit with the first logic cells during a second operating mode.

21. The electronic circuit of claim 12, further comprising:
a controller coupled to the logic cells and operable to shift the first data into the shift register during the operating mode; and
wherein the detector is further operable to prohibit the shift register from receiving data from the controller if the first portion of the first data does not have the predetermined relationship to the predetermined value.

22. The electronic circuit of claim 12 wherein:
the detector is operable to receive a mode signal having a first level during the operating mode;
if the first mode signal has the first level, the detector is operable to compare the first portion of the first data to the first predetermined value and to generate the warning signal if the first portion of the first data does not have the predetermined relationship to the first predetermined value; and
if the first mode signal does not have the first level, the detector is operable to compare the first portion of the first data to a second value and to generate the warning signal if the first portion of the first data does not have the predetermined relationship to the second value.

23. The electronic circuit of claim 12 wherein:
the detector is operable to receive a mode signal having a first level during the operating mode;
if the first mode signal has the first level, the detector is operable to compare the first portion of the first data to the first predetermined value and to generate the warning signal if the first portion of the first data does not have the predetermined relationship to the first predetermined value; and
if the first mode signal does not have the first level, the detector is operable to compare the first portion of the first data to a second random value and to generate the warning signal if the first portion of the first data does not have the predetermined relationship to the second random value.

24. The electronic circuit of claim 12 wherein the detector is further operable to:
compare a second portion of the first data to a second predetermined value; and
generate the first warning signal if the second portion of the first data does not have a predetermined relationship to the second predetermined value.

25. The electronic circuit of claim 12 wherein the detector is further operable to:
compare a second portion of the first data to a second predetermined value; and
generate a second warning signal if the second portion of the first data does not have a predetermined relationship to the second predetermined value.

26. An electronic system, comprising:
an electronic circuit, comprising,
first logic cells configurable to compose a shift register that is operable to receive first data during a first operating mode; and
a detector circuit coupled to the shift register and operable to,
compare a first portion of the first data to a first predetermined value, and
generate a warning signal if the first portion of the first data does not have a predetermined relationship to the predetermined value.

27. The electronic system of claim 26 wherein the electronic circuit comprises an integrated circuit.

28. The method of claim 26 wherein comparing the first portion of the first data comprises comparing the first portion of the first data a predetermined time after commencing the shifting of the first data into the shift register.

29. A method, comprising:
receiving a first mode signal having a first level that corresponds to a first operating mode;
simultaneously receiving a second mode signal having a second level corresponding to a second operating mode; and
generating a first warning signal in response to the second mode signal having the second level while the first mode signal has the first level.

30. The method of claim 29 wherein:
the first mode signal comprises a test enable signal;
the first operating mode comprises a non test mode;
the second mode signal comprises a scan enable signal; and
the second mode comprises a scan test mode.

31. The method of claim 29, further comprising:
configuring logic cells as a scan test shift register in response to the second mode signal having the second level, each of the logic cells storing respective data; and
modifying the data stored in at least one of the logic cells in response to the warning signal.

32. The method of claim 29, further comprising:
configuring logic cells as a scan test shift register in response to the second mode signal having the second level, each of the logic cells storing respective data; and
erasing the data stored in at least one of the logic cells in response to the warning signal.

33. The method of claim 29 wherein:
the first level comprises a first logic level; and
the second level comprises a second logic level that is different than the first logic level.

34. The method of claim 29, further comprising:
receiving simultaneously with the first mode signal a third mode signal having a third level corresponding to the second operating mode; and
generating a second warning signal in response to the third mode signal having the third level while the first mode signal has the first level.

35. The method of claim 29 wherein receiving the first and second mode signals comprises receiving the first and second mode signals during the first operating mode.

36. A method, comprising:
receiving first and second mode signals, at least one of the first and second mode signals having a first level that corresponds to a first operating mode;
simultaneously receiving a third mode signal having a second level corresponding to a second operating mode; and
generating a first warning signal in response to the third mode signal having the second level while the at least one of the first and second mode signals has the first level.

37. A method, comprising:
receiving a first mode signal having a first level that corresponds to a non test operating mode;
simultaneously receiving a second mode signal having a second level corresponding to a scan test operating mode; and
disabling a circuit from operating in a scan test mode in response to the second mode signal having the second level while the first mode signal has the first level.

38. The method of claim 37 wherein disabling the circuit comprises disabling logic cells from forming a shift register.

39. The method of claim 37 wherein disabling the circuit comprises erasing data stored in a logic cell that composes a shift register in response to the second mode signal having the second level.

40. A method, comprising:
configuring first logic cells as a shift register;
shifting first data into the shift register;
comparing a first portion of the first data to a first value, and
generating a first warning signal if the first portion of the first data does not have a predetermined relationship to the first value.

41. The method of claim 40 wherein the first data comprises scan test data.

42. The method of claim 40, further comprising disabling the shift register in response to the first warning signal.

43. The method of claim 40, further comprising altering data stored in the shift register in response to the first warning signal.

44. The method of claim 40 wherein comparing the first portion of the first data comprises comparing the first portion of the first data after shifting the first portion of the first data into the shift register.

45. The method of claim 40 wherein the first value comprises a predetermined value.

46. The method of claim 40 wherein the first value comprises a random value.

47. The method of claim 40, further comprising:
comparing a second portion of the first data to a second predetermined value; and
generating the first warning signal if the second portion of the first data does not have a predetermined relationship to the second predetermined value.

48. The method of claim 40 further comprising:
comparing a second portion of the first data to a second predetermined value; and
generating a second warning signal if the second portion of the first data does not have a predetermined relationship to the second predetermined value.

49. The method of claim 40 wherein generating the first warning signal comprises generating the first warning signal if the first portion of the first data does not equal the predetermined value.

50. A method, comprising:
configuring first logic cells as a shift register;
shifting first data into the shift register;
comparing a first portion of the first data to a first value, and
prohibiting the shift register from providing accurate data if the first portion of the first data does not have a predetermined relationship to the first value.

51. The method of claim 50 wherein prohibiting comprises altering the data stored in the shift register.

52. The method of claim 50 wherein prohibiting comprises disabling the shift register from shifting out data.

* * * * *